US005210006A

United States Patent [19]

Sondergeld

[11] Patent Number: 5,210,006

[45] Date of Patent: May 11, 1993

[54] PROCESS FOR PREPARING MOUNTING TAPES FOR AUTOMATIC MOUNTING OF ELECTRONIC COMPONENTS

[75] Inventor: Manfred Sondergeld, Mühlheim/Main, Fed. Rep. of Germany

[73] Assignee: E. I. du Pont de Nemours and Company, Wilmington, Del.

[21] Appl. No.: 708,277

[22] Filed: May 31, 1991

[30] Foreign Application Priority Data

Jun. 2, 1990 [DE] Fed. Rep. of Germany ....... 4017863

[51] Int. Cl.[5] .......................... G03F 7/00; C23F 1/02

[52] U.S. Cl. .................................... 430/312; 430/314; 430/318; 430/319; 156/643; 156/659.1; 156/661.1; 156/664

[58] Field of Search ............... 430/311, 312, 313, 314, 430/318, 319, 329; 156/625, 629, 643, 659.1, 660, 661.1, 664

[56] References Cited

U.S. PATENT DOCUMENTS

| | | | |
|---|---|---|---|
| 3,469,982 | 9/1969 | Celeste | 96/35.1 |
| 3,781,596 | 12/1973 | Galli et al. | 317/101 F |
| 4,209,355 | 6/1990 | Burns | 156/630 |
| 4,259,436 | 3/1981 | Tabuchi | 430/314 |
| 4,396,457 | 8/1983 | Bakermans | 156/634 |
| 4,411,719 | 10/1983 | Lindberg | 156/64 |
| 4,494,688 | 1/1985 | Hatada et al. | 228/189 A |
| 4,510,017 | 4/1985 | Barber | 156/651 |
| 4,587,395 | 5/1986 | Oakley et al. | 219/121 LD |
| 4,604,342 | 8/1986 | Sondergeld et al. | 430/281 |
| 4,701,363 | 10/1987 | Barber | 428/137 |
| 4,795,694 | 1/1989 | Groeber | 430/314 |
| 4,878,990 | 11/1989 | Dugan | 430/318 |

FOREIGN PATENT DOCUMENTS

| | | |
|---|---|---|
| 0070691 | 1/1983 | European Pat. Off. . |
| 14567A1 | 11/1989 | Fed. Rep. of Germany . |

OTHER PUBLICATIONS

Ken Smith, "Tab Re-Emerges", *Electronic Production*, Nov. 1988, pp. 9 and 10.

*Primary Examiner*—Cynthia Hamilton
*Assistant Examiner*—Kathleen Duda
*Attorney, Agent, or Firm*—Thomas H. Magee

[57] ABSTRACT

The process of the invention produces tapes for automatic mounting of electronic components. These mounting tapes have metallic conductive tabs with metallic bumps on at least one of their ends. The metallic bumps can be thermally welded or soldered, have well-defined areas and heights, and adhere well to the conductive tabs.

10 Claims, No Drawings

PROCESS FOR PREPARING MOUNTING TAPES FOR AUTOMATIC MOUNTING OF ELECTRONIC COMPONENTS

BACKGROUND OF THE INVENTION

This invention pertains to a process for preparing a mounting tape with metallic conductive tabs having, on at least one of their ends, metallic protrusions that can be thermowelded or soldered.

Mounting tapes are needed for automatic mounting of electronic components, a process called Tape Automated Bonding (TAB). These mounting tapes have metallic conductive tabs, the ends of which are bonded during the mounting process with the corresponding connection points on the electronic components. The bonding of the metallic conductive tabs with the electronic components is accomplished, preferably, through metallic protrusions that can be thermowelded or soldered, the so-called bumps. These consist preferably of metals softer than the conductive tabs and can be located either on the electronic components or on the conductive tabs of the mounting tape. The latter embodiment is preferred because it dispenses with the expensive process of placing metallic bumps on many different electronic components, and it permits using just one mounting tape for all components.

Known mounting tapes are monolayer tapes consisting only of a metal layer, and multilayer tapes with a dielectric support layer in addition to a metal layer with, optionally, one or more adhesive layers between the metal layer and the support layer. Mounting tapes are also known with metal layers and optional adhesive layers on both sides on the support layer. Two-layer or three-layer tapes consisting of a support layer and a metal layer, or these layers with an additional adhesive layer, are preferred. Multilayer tapes have personality windows in the support layer, and optionally in the adhesive layer, into which the metallic conductive tabs fit, thereby allowing the tabs to be easily brought into contact with the electronic components. The support layer also contains the usual sprocket holes for transport. A fundamental advantage of multilayer tapes compared to monolayer tapes is that components placed in contact with the former can be tested before final mounting, because there are no conductive connections between individual metallic conductive tabs on multilayer tapes.

Significant problems have always occurred in preparing mounting tapes with metallic conductive tabs having metallic bumps on at least one of their ends for easier and better contact with electronic components. Many preparation processes have indeed been proposed, but none has been completely satisfactory. U.S. Pat. No. 4,396,457 discloses a process for producing metallic bumps by stamping. However, these bumps are merely bulges in the conductive tabs and do not contribute to stabilizing the bonding to electronic components. In addition, this process damages, thus rendering useless, the delicate metal layer of the conductive tab by the high mechanical stress in stamping.

Other methods disclose preparing metallic conductive tabs and metallic bumps by etching processes. U.S. Pat. No. 4,411,719 and DE-A 29 26 200 (U.S. Pat. No. 4,209,355) describe processes for etching different sides of the mounting tape. In U.S. Pat. No. 3,781,596, both etching steps are performed from the same side. In EP-A 02 32 108, (U.S. Pat. No. 4,701,363) two different photoresists are applied one atop the other, such that selective deep etching of the metal can result, with simultaneous formation of conductive tabs and bumps. The disadvantage of these processes is that different resists and coating processes are required and that the exact registration of different exposure masks can be accomplished only with great difficulty on different sides of the mounting tape.

EP-A 01 17 348 (U.S. Pat. No. 4,587,395) discloses laser treatment to melt the ends of the metallic conductive tabs to metallic beads. However, all of the cited processes have the disadvantage that the metallic bumps can be prepared only from the same material as the conductive tabs. EP-A 00 70 691 and "Electronic Production", November 1988, pages 9–10, describe a mounting tape on which the metallic bumps consist of a metal, preferably gold, softer than the conductive tabs. In this process, the conductive tabs are prepared first. As gold is used as the etching resist, the process becomes extremely expensive. With the use of a second resist, gold bumps are then electrodeposited on these gold-coated conductive tabs. However, good adhesion of these bumps on the gold-coated conductive tabs can be achieved only by special pretreatment of the gold coating.

The process in U.S. Pat. No. 4,510,017 does not start with a dielectric support layer in which personality windows and sprocket holes usually have already been produced, but rather prepares dielectric sites on the mounting tape by filling the spaces between conductive tabs with dielectric material. This process also uses a gold coating as an etching resist, which makes the preparation of mounting tapes by this expensive process even more costly.

In U.S. Pat. No. 4,259,436 and EP-A 02 49 834 (U.S. Pat. No. 4,795,694), conductive tabs with bumps of metals other than those of the tabs were prepared by a combination of etching one side and plating the other side of the mounting tape. This requires two exposure masks, which must be positioned for accurate registration on different sides of the mounting tape.

EP-B 00 61 863 (U.S. Pat. No. 4,494,688) describes a process in which the metallic bumps are prepared separately on an intermediate support and then transferred onto the conductive tabs. This requires an additional support layer. In addition, transfer of the bumps is made more difficult by problems in accurate positioning and in separating the bumps from the intermediate support. During the transfer, the delicate conductive tabs can be easily bent or even destroyed.

As evidenced by the multiplicity of proposed processes, there is great interest in obtaining practical and versatile processes for preparing mounting tapes with metallic conductive tabs bearing on at least one of their ends bumps that can be thermowelded or soldered. However, the known processes involve considerable difficulties. They are protracted and expensive, require complicated process steps and exacting conditions, or they are useful only for special mounting tapes, such as monolayer tapes or those with metallic bumps of the same metal as the conductive tabs.

Therefore, the problem involved in the present invention is to make available a process for preparing mounting tapes with metallic conductive tabs bearing metallic bumps on at least one of their ends, without the disadvantages of the currently known processes. In addition, the metallic bumps should have well defined areas and heights and outstanding adhesion to the conductive tabs. The process should also produce mounting tapes with uniformly high quality and yield. Furthermore, the process should be capable of producing all types of mounting tapes and the material of the metallic bumps should not be limited to that of the conductive tabs.

SUMMARY OF THE INVENTION

The present invention is a process comprising the following steps:

a) coating the metal surface of a metal or metal-coated tape with a light-sensitive composition,
b) exposing the light-sensitive layer through a transparency with a pattern corresponding to the metallic bumps to be formed,
c) removing the exposed layer areas corresponding to the metallic bumps to be formed, with the formation of an electroplating resist,
d) forming the metallic bumps by electrodeposition of a metal,
e) removing the electroplating resist,
f) re-applying a light-sensitive composition on the metal surface of the mounting tape, covering the already-formed metallic bumps,
g) exposing the light sensitive layer through a transparency with a pattern corresponding to the metallic conductive tabs to be formed,
h) removing the exposed layer areas corresponding to the metal areas to be removed, with the formation of an etching resist,
i) removing the exposed metal, and
j) removing the etching resist.

DETAILED DESCRIPTION OF THE PREFERRED EMBODIMENT

The process of the invention is suitable for producing all current mounting tapes. The process is particularly suitable for producing two-layer or three-layer tapes. These multilayer tapes are usually provided with the required personality windows and sprocket holes by a pretreatment. In most cases, a metal layer, preferably of copper, is applied on a support layer with punched-out windows and holes. A light-sensitive composition is applied onto the metal surface, which has been optionally pre- cleaned and/or chemically etched, and the composition is exposed with actinic light through a transparency with a pattern corresponding to the metallic bumps to be formed. Optional existing protective layers can be removed before or after exposure.

A preferred light-sensitive composition is at least one polymeric binder, at least one addition-polymerizable, ethylenically unsaturated compound, and a photoinitiator or photoinitiator system. Suitable binders contain vicinal carboxyl groups and amide groups, in particular the polymers of DE-A38 14 567. Preferred monomers are those with phenolic hydroxyl groups, such as are described in DE-A 34 41 787 (U.S. Pat. No. 4,604,342). Other additives, such as fillers, inhibitors, dyes, etc. can, of course, be used.

The preferred light-sensitive composition is a dry film resist that is applied by lamination onto the metal surface, as is described, for example, in U.S. Pat. No. 3,469,982. After removal of the resist areas corresponding to the metallic bumps to be formed—in the case of the above-described compositions by washing off the unexposed areas with an aqueous alkaline solution—an optional thermal posthardening can be performed.

The metallic bumps are then applied by a suitable electroplating process. The bumps are formed preferably of metals that are softer than the conductive tab metal. The metals of EP-A 00 70 691 are especially suitable, particularly gold. The metal surface to be plated can be prepared optionally according to any conventional process. No special processes are necessary as in the use of gold as an etching mask. After the electroplating process, the resist is removed. In the case of the preferred resists, this is accomplished generally by a strong, alkaline, aqueous solution.

Next, another light-sensitive composition, the same as in the first step, or optionally different, is coated onto the optionally cleaned tape and over the metallic bumps. A composition with the binders of DE-A 38 14 567 and the monomers of DE-A 34 41 787 (U.S. Pat. No. 4,604,342) is again preferred. The use of this composition in the form of a dry film resist is particularly advantageous. By this means, coating is possible by simple and current lamination processes. The metal surfaces, the conductive tabs to be formed and the already formed metallic bumps can be completely protected in this manner.

After exposure through a transparency with the conductive tab pattern and removal with a suitable solvent of the resist areas that do not correspond to the conductive tabs—in the case of the preferred resists, a suitable solvent is an aqueous alkaline solution—the resulting etching resist can be optionally posthardened thermally. Then,. the exposed metal is removed by one of the known processes. Next, the etching resist is removed, optionally, by a strong alkaline, aqueous solution. The last step can be an optional overall gold plating of the conductive tabs and their metallic bumps.

To protect, during the electroplating and etching process steps, the exposed metal in the personality windows of the support layer, the windows are also coated with an electroplating or etching resist. This is accomplished preferably with the same material and in the same manner as for the metal surface.

EXAMPLE

A flexible support tape laminated with 35 μm copper, in which support tape personality windows have already been punched out, was immersed for 20 seconds in a commercial precleaning bath (Schloetter S 20), rinsed with water, etched for one minute in an ammonium persulfate solution, rinsed again with water, and dried.

A dry resist film in accordance with Example 1, DE-OS 38 14 567 on a 12 μm polyester base was laminated on both sides of the precleaned tape with a Riston ® hot roll laminator at a roller temperature of 110° C. and at a rate of 1.2 m/min.

The backside resist was exposed overall and the resist coated on the copper was exposed through a photo transparency with the pattern of the metallic bumps to be formed at 100 $mj/cm^2$ in a commercial 1000 W exposure device from Theimer Co.

After removal of the polyester sheet, the resist was developed with 1% sodium carbonate solution at 30° C. in a commercial developing machine from Schmid Co.

After development, the resist was heated for 15 minutes at 150° C.

After precleaning and etching (as above), gold was electroplated on the exposed copper surfaces in a Jet Plater with an ESP 400 gold bath from Englehard Co. by the pulse plating process at an average amperage of 20 A/dm$^2$ for five minutes. An electroplate thickness of 35 $\mu m$ was achieved without any strike deposits.

The resist was then removed in a 3% potassium hydroxide solution at 56° C. for 60 seconds.

After another precleaning and etching, the same type of dry resist film was laminated onto both sides of the support tape under the same conditions as described above. The gold bumps already deposited on the copper surface were enclosed and covered satisfactorily by the resist.

As described above, the backside resist was again exposed overall and the resist coated on the copper was exposed through a photo transparency with the negative of the copper conductive tabs to be formed. After removal of the polyester film, the resist was developed as described above.

The exposed copper was removed in a commercial etching machine from FSL Co. with Hunt Accu-Gard etching solution at 50° C., a pH=8.2 in the etching solution, and pH=9.5 in the replenisher solution.

The resist was again removed in a 3% potassium hydroxide solution at 56° C. for 35 seconds.

Satisfactory conductive tabs were obtained with well defined gold bumps on the tab ends.

The process of the invention produces bumps that can be thermowelded or soldered and that adhere very well to the conductive tabs. The bumps are electroplated directly onto the conductive tabs, so that the simple, conventional processes of the printed circuit board industry can be used, and special pretreatment of the surface to be electroplated is not required. The metallic bumps can be prepared reproducibly with well defined areas and heights, and they can consist of any metal or metal alloy. The process of the invention is suitable for producing all multilayer and monolayer tapes.

The step of producing the conductive tabs via a gold etching mask, as is required in many known processes, is completely eliminated. Thus, the production of mounting tapes by the process of the invention is significantly less expensive. By adapting the photo transparency to producing the photoresist etching mask in the form of spreading lines, the degree of undercutting can be taken into account. In this manner, a suitable conductive tab cross-section is achieved, and the entire base surfaces of the metallic bumps are in contact with the tabs. This avoids the problem of a thin gold layer extending freely beyond the tabs, a problem that in older processes led to the gold breaking off and ultimately to irregular conductive tabs.

It was unexpected that the second light-sensitive composition for producing the metallic conductive tabs can be applied over existing metallic bumps without additional process steps. In particular, it was surprising that the advantageous dry film resists can be applied easily by lamination over the metallic bumps without damaging the soft, not very mechanically stable metallic bumps. In addition, it was not foreseeable that dry film resists can be applied over metallic bumps without air bubbles, as are known in the application of dry film solder masks. Such air bubbles would result in the processing liquids being able to penetrate around the conductor lines or metallic bumps and lead to uncontrolled etching, etc. It was particularly surprising that satisfactory lamination is also possible without the use of a vacuum laminator. It is especially advantageous if the thickness of the resist equals or exceeds the height of the metallic bumps. A further advantage is that applying metallic bumps on the overall surface of the metal layer and then laminating a photoresist on this overall surface of the metal layer to produce the conductive tabs prevents damaging already formed tabs in producing metallic bumps by the reverse sequence of the process steps.

What is claimed is:

1. Process for preparing a mounting tape with metallic conductive tabs having metallic bumps on at least one of their ends, comprising the following process steps:

a) coating a metal surface of a mounting tape with a light-sensitive composition, thereby forming process electroplating resist;
b) exposing the light-sensitive composition through a transparency with a pattern corresponding to the metallic bumps to be formed,
c) removing the exposed area corresponding to the metallic bumps to be formed,
d) forming the metallic bumps by electrodeposition of a metal,
e) removing the electroplating resist,
f) re-applying a light-sensitive composition layer on the metal surface of the mounting tape, covering the already-formed metallic bumps, thereby forming an etching resist,
g) exposing the light-sensitive layer through a transparency with a pattern corresponding to the metallic conductive tabs to formed,
h) removing the exposed layer areas corresponding to the metal areas to be removed,
i) removing the exposed metal, and
j) removing the etching resist.

2. Process in accordance with claim 1, characterized in that the electroplating resist the etching resist are hardened thermally before the electroplating step and the etching step respectively.

3. Process in accordance with claim 1, characterized in that the light-sensitive composition is applied by lamination in step a) and/or step f) in the form of a dry resist.

4. Process in accordance with claim 1, characterized in that the light-sensitive composition for preparing the electroplating resist and/or etching resist contains at least one polymeric binder, at least one addition-polymerizable, ethylenically unsaturated compound, and a photoinitiator or a photoinitiator system.

5. Process in accordance with claim 1, characterized in that the metallic bumps are of a metal softer than the metallic conductive tabs.

6. Process in accordance with claim 1, characterized in that the mounting tape consists of a dielectric support layer and a metal layer.

7. Process in accordance with claim 6, characterized in that an adhesive layer is present between the support layer and the metal layer.

8. Process in accordance with claim 6, characterized in that personality windows and/or sprocket holes are in the dielectric support layer.

9. Process in accordance with claim 8, characterized in that the personality windows are protected during the process by resist material that is removed at the end of the process.

10. Process in accordance with claim 1, characterized in that after all process steps are accomplished, the metallic conductive tabs and the metallic bumps are completely gold plated.

* * * * *